Jan. 14, 1969 P. J. WHORISKEY 3,422,323

FIVE-LAYER LIGHT-ACTUATED SEMICONDUCTOR DEVICE HAVING BEVELLED SIDES

Filed March 18, 1966

INVENTOR
PETER J. WHORISKEY
BY Robert [signature]
ATTORNEY

United States Patent Office 3,422,323

Patented Jan. 14, 1969

3,422,323

FIVE-LAYER LIGHT-ACTUATED SEMICONDUCTOR DEVICE HAVING BEVELLED SIDES

Peter J. Whoriskey, Winchester, Mass., assignor to P. R. Mallory & Co. Inc., Indianapolis, Ind., a corporation of Delaware Filed Mar. 18, 1966, Ser. No. 535,455

U.S. Cl. 317—235 8 Claims

Int. Cl. H01l *11/00; 15/02*

ABSTRACT OF THE DISCLOSURE

A five-layer photosensitive semiconductor diode is fabricated on a die having bevelled edges to expose the inter-layer junctions symmetrically to light directed toward the top of the die. The top of the die is covered with an opaque material. Contacts for the first and fourth diode layers and contacts for the second and fifth layers are connected so as to conduct full-wave current through the device when it is exposed to light. The fourth and fifth layers may be bonded to a heat sink.

The present invention relates to light actuated semiconductive devices and more particularly to the means and methods for providing a light actuated, alternating current switch.

At the present time, there are light actuated switches, usually referred to as light actuated silicon controlled rectifiers, for conducting current in one direction when light impinges on said device. These contemporary devices, which will be described in more detail later in this specification, depend on the impinging of light to create hole-and-electron pairs in the vicinity of one of three junctions. In a typical four layer device, the light must impinge on the junction that is reversed biased in order for current to flow from the anode to the cathode.

To date, light actuated bi-polar devices, devices that will conduct full-wave current when actuated by light, have not been available. Thus, elaborate and expensive gating circuits have been required to turn on alternating current switches.

The present invention is a light actuated semiconductive device that will conduct full-wave alternating current in both directions when actuated by light. In addition, the device of the present invention is symmetrical so as to conduct equally in both directions.

The device of the present invention functions as the equivalent of two four layer diodes connected in parallel so as to conduct full-wave current through a load when the device is actuated by light. That is, when the device of the present invention is connected in a circuit, it will be the equivalent of an NPNP and PNPN diode connected in parallel.

The double or bi-polar switching of full-wave current is achieved in the device of the present invention by beveling the sides of a die so that the total light flux falls symmetrically on the junctions of each equivalent diode contained therein. Also, the light falls on all three junctions of each of the two diodes formed in the die.

The light actuated semiconductive device of the present invention has all of the advantages of any light actuated silicon controlled rectifier. Such advantages are isolation of input and output, compactness, and ruggedness.

The device of the present invention is especially advantageous in that it can switch full-wave alternating current without the necessity of additional silicon controlled rectifiers for gating on said device. That is, the device of the present invention will conduct full-wave current as long as it is in the presence of sufficient light.

The device of the present invention can, however, be gated on by the light output of a timing circuit such as is used in typical phase control or power control circuits.

The device of the present invention has wide application as a replacement for a relay and as a control element in logic circuits, phase control or power control circuits, industrial controls of all types, photoelectric controls, etc.

It is an object of the present invention, therefore, to provide a light actuated semiconductive device for conducting full-wave alternating current.

It is another object of the present invention to provide a light actuated, alternating current switch which is entirely contained in a single multilayered semiconductive die.

It is a further object of the present invention to provide a light actuated semiconductive device which is the equivalent of two four layer diodes connected in parallel so as to conduct full-wave alternating current.

It is still another object of the present invention to provide a light actuated semiconductive device comprised of a die formed by a plurality of alternating layers of n-type and p-type semiconductive material, said die having beveled sides so as to symmetrically expose the junctions between said alternating layers of n-type and p-type semiconductive material to light directed towards the top and said die, and means for covering said die so as to prevent said device from being actuated by light impinging on the top thereof.

It is yet another object of the present invention to provide a five layer semiconductive device for conducting full-wave alternating current in the presence of light.

It is still a further object of the present invention to provide a light actuated silicon device for conducting full-wave current in the presence of light.

It is another object of the present invention to provide a semiconductive die formed of a first layer of n-type material, a second layer of p-type material, a third layer of n-type material, a fourth layer of p-type material, and a fifth layer of n-type material.

It is still a further object of the present invention to provide a semiconductive device having five alternating layers or regions of n-type and p-type semiconductive material.

The present invention, in another of its aspects, relates to novel features of the instrumentalities described herein for teaching the principal object of the invention and to the novel principles employed in the instrumentalities whether or not these features and principles may be used in the said object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which.

Generally speaking, the present invention is a light actuated semiconductive device comprised of a die formed by a plurality of alternating layers of n-type and p-type semiconductive material and a means for covering said die so as to prevent said device from being actuated by light impinging on the top thereof. The die has beveled sides so as to symmetrically expose the junctions between the alternating layers of n-type and p-type semiconductive material to light directed towards the top of said die.

In one embodiment, the present invention is a light actuated, alternating current switch comprised of a die of five alternating layers of n-type and p-type silicon material, an opaque means for covering said die so as to prevent said device from being actuated by light impinging on the top thereof, means for contacting a first layer and a fourth layer so as to provide an NPNP diode, and means for contacting a second layer and fifth layer so as to provide a PNPN diode. The PNPN and NPNP diodes are connected in parallel so as to conduct full-wave current through the device when the junctions between the layers are exposed to light. The die of this embodiment also has beveled sides so as to symmetrically expose the aforementioned junctions to light directed towards the top of the die.

Figure 1:
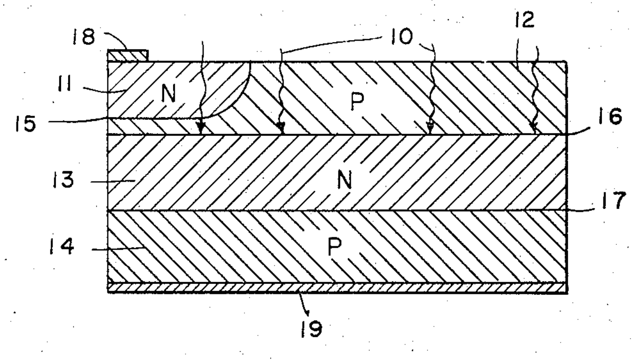
FIGURE 1 is a section view of a contemporary light actuated semiconductive device.

Referring now to the drawing, and particularly to the sectional view of FIGURE 1, the structure of contemporary light actuated devices can be visualized in conjunction with the following description.

Contemporary light actuated semiconductive devices, and particularly light actuated semiconductive switches, are actuated by light incident on the top of the semiconductive die. In FIGURE 1, it can be seen that the light incident on the top of the die, represented by the arrows 10 affects only the junction between the n-type region 13 and the p-type region 12.

Devices have been made in the form shown in FIGURE 1 using silicon as the semiconductive material. Such devices are usually referred to as light actuated silicon controlled rectifiers. The cathode electrode is the metallic portion designated as 18 and the anode electrode in the metallic portion designated as 19. With the normally applied forward voltage, the anode 19 connected to the positive voltage terminal and the cathode 18 connected to the negative voltage terminal, the junctions 15 and 17 are forward-biased and they can conduct if free carriers are present. The junction 16 is reversed-biased, however, and blocks current flow. Since the light incident to the silicon creates hole-and-electron pairs in the vicinity of the junction 16 which are swept across the junctions 15, 16 and 17, a small current flows from the anode 19 to the cathode 18. As the light is increased, this current increases until the gain becomes unity and the light actuated silicon controlled rectifier switches into conduction.

Light actuated semiconductive devices, especially light actuated silicon devices, are triggered into conduction when the radiant energy falling on the device exceeds a given threshold level. The threshold level is determined in part by the junction temperature, applied voltage, impedance of the load, and the surface configuration of the device. The present invention utilizes the configuration of the device to obtain optimal switching characteristics for a symmetrical bi-polar device.

Figure 2:
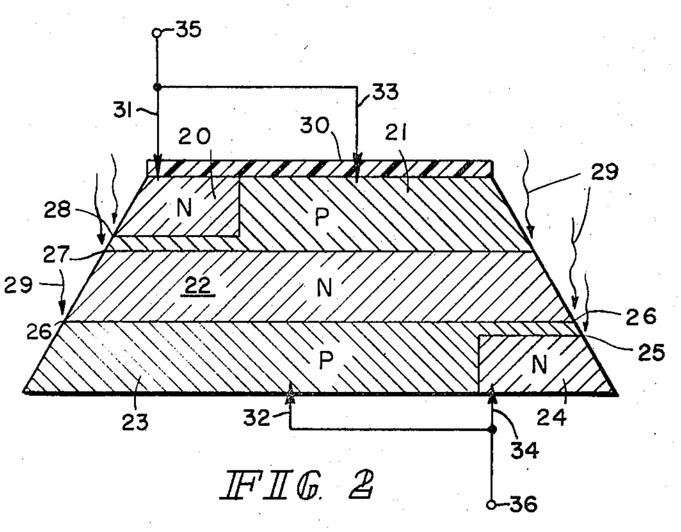
FIGURE 2 is a sectional view of the light actuated semiconductive device of the present invention.

Referring now to FIGURE 2, the light actuated device of the present invention can be discussed.

There are five semiconductive layers consisting of the n-type layer 20, p-type layer 21, n-type layer 22, p-type layer 23, and n-type layer 24. Thus, there is a junction 25 between the p-type layer 23 and n-type layer 24, a junction 26 between the n-type layer 22 and p-type layer 23, a junction 27 between the p-type layer 21 and n-type layer 22 and a junctior 28 between the n-type layer 20 and p-type layer 21.

It can be seen that the die, containing the five layers 20, 21, 22, 23 and 24 is bevelled so that the incident light 29 can symmetrically strike all of the junctions 25, 26, 27 and 28. The choice of an angle between the sides and the base of the die is empirical, the smaller the value, the larger the generating surface attained. Means 31 and 32 are provided for electrically contacting the first layer 20 and the fourth layer 23 respectively, so as to provide an NPNP diode. Means 33 and 34 are provided for contacting the second layer 21 and the fifth layer 24 respectively, so as to provide a PNPN diode. These two diodes are effectively coupled in parallel by connecting the means 31 and 33 to a first common electrode or terminal 35, and by connecting the means 32 and 34 to a second common electrode or terminal 36.

Since the five layer device of the present invention is actually a PNPN diode and an NPNP diode coupled in parallel so as to permit current flow in both directions through the device, light falls simultaneously on the three junctions of each diode. When either diode is forward-biased, it will switch into the conducting mode when the light flux impinging on the junctions reaches the threshold or triggering level of the device.

A layer of opaque material 30 is bonded over the die so as to prevent light from actuating the device through the n-type layer 20 and the p-type layer 21 and to confine it to the beveled edges, thereby making the device symmetrical.

It is customary to short the gate electrode and cathode electrode to decrease the sensitivity of the device. In FIGURE 2, the n-type layer 20 is a cathode electrode and the p-type layer 21 is the gate electrode for one diode and the n-type layer 24 is the cathode and the p-type layer 23 is the gate electrode for the other diode. Since the diodes are connected in parallel, it is obvious that one set of gate and cathode electrodes will be shorted together.

It can be seen that the first layer 20 is an n-type region which is diffused into the second layer 21 from the top of the die and that the fifth layer 24 is an n-type region diffused into the fourth layer 23 from the bottom of the die.

In a specific embodiment, the present invention is a light actuated, alternating current switch comprised of a die of five alternating layers of n-type and p-type silicon, said die having beveled sides so as to symmetrically expose the junctions between said alternating layers of n-type and p-type silicon to light directed towards the top of said die, and an opaque means for covering said die so as to prevent said device from being actuated by light impinging on the top thereof. Of course, there must be a means for contacting the first layer 20 and the fourth layer 23 so as to provide an NPNP diode and a means for contacting the second layer 21 and the fifth layer 24 so as to provide a PNPN diode.

The light actuated semiconductive device of the present invention, as hereinbefore described in one of its embodiments, is merely illustrative and not exhaustive in scope. Since many widely different embodiments of the invention may be made without departing from the scope thereof, it is intended that all matter contained in the above description and shown in the accompanying drawing shall be interposed as illustrative and not in a limiting sense.

What is claimed is:

1. A light actuated, alternating current switch comprising: a die of five alternating layers of n-type and p-type silicon material, said die having beveled sides so as to symmetrically expose the junctions between said alternating layers of n-type and p-type silicon to light directed towards the top of said die; an opaque means for covering said die so as to prevent said device from being actuated by light impinging on the top thereof; and means for contacting a first layer and a fourth layer so as to provide an NPNP diode and means for contacting a second layer and a fifth layer so as to provide a PNPN diode, said NPNP diode being connected in parallel with said PNPN diode so as to conduct full-wave current through said die when the junctions between said layers are exposed to light.

2. A light actuated, alternating current switch as in claim 1 wherein said first and fifth layers are n-type silicon regions, said first layer being diffused into said second layer from the top of said die and said fifth layer being diffused into said fourth layer from the bottom of said die.

3. A light actuated, alternating current switch as in claim 1 wherein said first and fifth layers are diametrically disposed in said die.

4. A light actuated semiconductive device as in claim 1 wherein said semiconductive material is silicon.

5. A light actuated semiconductive device as in claim 1 wherein a first of said layers is n-type material, a second of said layers is p-type material, a third of said layers is n-type material, fourth of said layers is p-type material, and a fifth of said layers is n-type material.

6. A light actuated semiconductive device as in claim 3 wherein said NPNP diode is provided in parallel with said PNPN diode by connecting a first common electrode between said first layer and said second layer and a second common electrode between said fourth layer and said fifth layer.

7. A light actuated semiconductive device as in claim 1 wherein said means for covering said die is an opaque wax.

8. A light actuated semiconductive device as in claim 5 wherein said fourth layer and said fifth layer are bonded to a heat sink, said heat sink being a common electrode for said layers.

References Cited

UNITED STATES PATENTS

| | | | |
|---|---|---|---|
| 3,328,584 | 6/1967 | Weinstein | 250—206 |
| 3,123,750 | 3/1964 | Hutson | 317—235 |
| 3,343,048 | 9/1967 | Kuehn | 317—234 |
| 2,871,377 | 1/1959 | Tyler | 307—88.5 |
| 2,980,832 | 4/1961 | Stein | 317—235 |

JOHN W. HUCKERT, *Primary Examiner.*

M. EDLOW, *Assistant Examiner.*

U.S. Cl. X.R.

250—211; 307—284; 317—237